United States Patent [19]

Suhara

[11] Patent Number: 5,144,635
[45] Date of Patent: Sep. 1, 1992

[54] SEMICONDUCTOR LASER DEVICE HAVING REFLECTANCE CONTROL FILM FORMED ON END FACET OF OSCILLATOR

[75] Inventor: Hajime Suhara, Yokohama, Japan

[73] Assignee: Kabushiki Kaisha Toshiba, Kawasaki, Japan

[21] Appl. No.: 717,322

[22] Filed: Jun. 18, 1991

[30] Foreign Application Priority Data

Jun. 19, 1990 [JP] Japan .................. 2-160929

[51] Int. Cl.⁵ .............................................. H01S 3/19
[52] U.S. Cl. ....................................................... 372/49
[58] Field of Search ........................................... 312/49

[56] References Cited

U.S. PATENT DOCUMENTS

| | | | |
|---|---|---|---|
| 4,840,922 | 6/1989 | Kobayashi et al. | 372/49 |
| 4,951,292 | 8/1990 | Kuindersma et al. | 372/49 |
| 4,975,922 | 12/1990 | Sakane et al. | 372/49 |

FOREIGN PATENT DOCUMENTS

| | | | |
|---|---|---|---|
| 0090135 | 10/1983 | European Pat. Off. | 372/49 |
| 0111386 | 7/1983 | Japan | 372/49 |
| 64-33987 | 2/1989 | Japan. | |
| 1184893 | 7/1989 | Japan. | |

*Primary Examiner*—Georgia Y. Epps
*Attorney, Agent, or Firm*—Oblon, Spivak, McClelland, Maier & Neustadt

[57] ABSTRACT

A reflectance control film is formed on the end facet of an oscillator in a semiconductor laser device. The reflectance control film has a laminated structure of a first thin film formed on the end facet of the oscillator and a second thin film formed on the first thin film. The film thickness of the first thin film is set to be "$\lambda/4n_1$" and $n_1 \leq 1.8$ where the peak wavelength of the oscillator is $\lambda$ and the refractive index of the first thin film is $n_1$. The film thickness of the second thin film is set to be "$\lambda/4n_2$" and $1.9 \leq n_2 \leq 2.6$ where the peak wavelength of the oscillator is $\lambda$ and the refractive index of the second thin film is $n_2$.

7 Claims, 1 Drawing Sheet

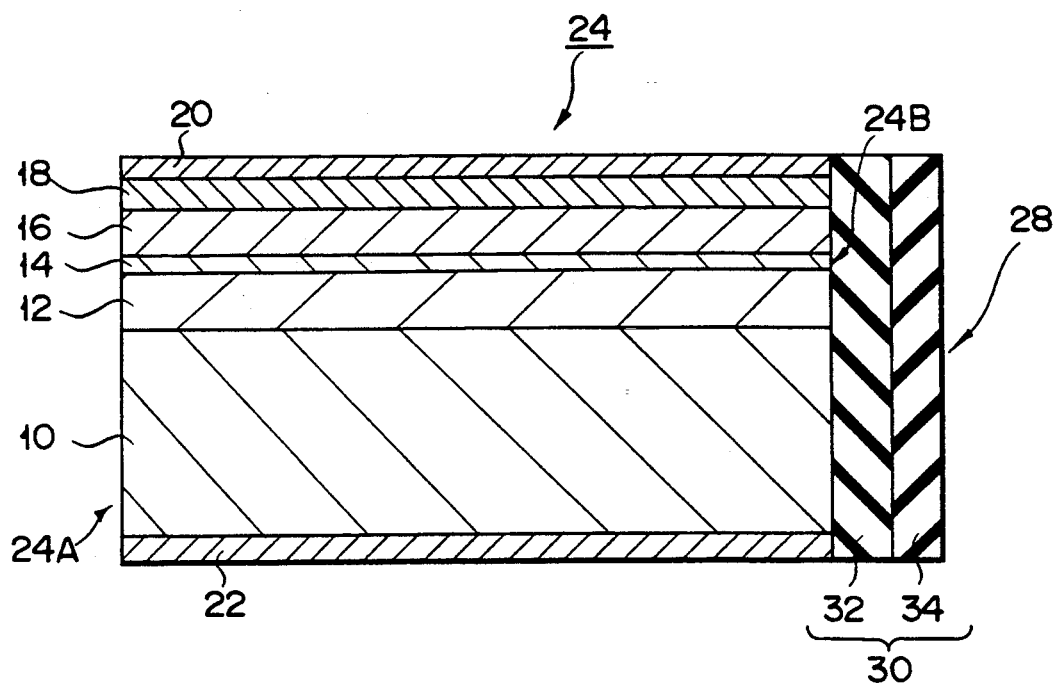
F I G. 1

SEMICONDUCTOR LASER DEVICE HAVING REFLECTANCE CONTROL FILM FORMED ON END FACET OF OSCILLATOR

BACKGROUND OF THE INVENTION

1. Field of the Invention

This invention relates to a semiconductor laser device, and more particularly to a semiconductor laser device having a reflectance control film formed on the end facet of an oscillator to enhance an output of an oscillated laser light.

2. Description of the Related Art

In a semiconductor laser device, it is well known in the art to form a reflectance control film on the end face of an oscillator in order to increase an output of an oscillated laser light. For example, the above reflectance control film may be formed by alternately laminating at least two thin films having different refractive indices so as to attain a large reflectance and increase the output of laser light. This type of semiconductor laser device is described in Japanese Patent Disclosure Nos. 64-33987 and 1-184893, for example.

A first thin film included in the thin films constituting the reflectance control film and formed in contact with the end facet of the oscillator is formed of material having a refractive index n of small value, and $SiO_2$ (n is approx. 1.5), $Al_2O_3$ (n is approx. 1.7) or $Si_3N_4$ (n is approx. 1.8) is often used as the material, for example. A second thin film formed on the first thin film is formed of material having a large refractive index and amorphous silicon ($n \geq 3.2$) is generally used. When the first thin film is formed of $SiO_2$, the second thin film is formed of $Al_2O_3$ or $Si_3N_4$. In order to form the first thin film, a vacuum deposition method (for $SiO_2$) and a sputtering method (for $Al_2O_3$, $Si_3N_4$ or amorphous silicon) may be used.

In a general system using a semiconductor laser device, a photo detecting element for monitoring is disposed on the end facet of the oscillator opposite to the laser light emitting surface thereof and the laser is driven in an APC (Auto Power Control) manner according to a monitoring current derived from the photo detecting element in order to obtain a constant laser light output. That is, the monitoring photo detecting element is disposed on the side of the reflectance control film of the oscillator to receive a laser light which has passed the reflectance control film so as to generate a monitoring current. However, as the reflex index of the reflectance control film increases, the amount of laser light incident on the monitoring photo detecting element decreases. Therefore, in order to efficiently receive the laser light, the monitoring photo detecting element must be set closer to the reflectance control film. For example, in a case where a normal InGaAs-series PIN photodiode is disposed as the photo detecting element on the semiconductor laser device having a reflectance control film with a reflectance of approximately 80%, a distance between the reflectance control film and the light receiving surface of the photo detecting element must be set to be less than 1 mm in order to derive a monitoring current of more than 0.05 mA. This imposes a large limitation on the optical and mechanical design.

In a case where an amorphous silicon film is used as one of the thin films constituting the reflectance control film, the reflectance thereof may become larger than 80% even if it is a two-layered film, and therefore the limitation on the optical design becomes further severe. If the amorphous silicon film is formed by the vacuum deposition method, the control of the vapor deposition speed and the reflectance becomes difficult, making the film chemically and physically unstable. As a result, the reliability of the semiconductor laser device manufactured is lowered. Therefore, it is not practical to form the amorphous silicon film by use of the vacuum deposition method and it is a common practice to form the same by use of the sputtering method which is low in production efficiency than the vacuum deposition method.

It is also difficult to form an $Al_2O_3$ or $Si_3N_4$ film by use of the vacuum deposition method, and the refractive index thereof is as small as 1.7 to 1.8 and therefore the effect that the reflectance is improved cannot be obtained unless the thin films are laminated to make a four- or more-layered film. The total number of thin films formed is desired to be as small as possible when the uniformity of the film, stress between the films, manufacturing yield, forming time and the like are taken into consideration.

SUMMARY OF THE INVENTION

An object of this invention is to provide a semiconductor laser device having a reflectance control film in which the optical design can be simplified.

Another object of this invention is to provide a semiconductor laser device having a reflectance control film which is highly reliable and permits the degree of freedom to be enhanced.

The above object can be attained by a semiconductor laser device comprising an oscillator for oscillating a laser light; a first film for reflectance control which is formed on the end face of the oscillator and in which the film thickness is set to be "$\lambda/4n_1$" and $n_1 \leq 1.8$ where the peak wavelength of the oscillator is $\lambda$ and the refractive index of the first thin film is $n_1$; and a second film for reflectance control which is formed on the first film and in which the film thickness is set to be "$\lambda/4n_2$" and $1.9 \leq n_2 \leq 2.6$ where the peak wavelength of the oscillator is $\lambda$ and the refractive index of the second thin film is $n_2$.

With the above construction, since the first thin film which has the refractive index $n_1$ set in the range of $n_1 \leq 1.8$ and the second thin film which has the refractive index $n_2$ set in the range of $1.9 \leq n_2 \leq 2.6$ are laminated to form the reflectance control film, the reflectivity of the reflectance control film can be set to an optimum value of 40 to 70%. Thus, a sufficiently large reflectance can be obtained even when the film is formed with a two-layered thin film and at the same time the limitation on the optical design caused by the excessively large reflectance can be reduced.

If the second thin film is formed of zirconium oxide, cesium oxide or zinc sulfide, the vacuum deposition speed and the refractive index can be easily controlled with high precision when it is formed by use of the vacuum deposition method. In addition, the films are chemically and physically made stable. Therefore, the reliability of the semiconductor laser device can be enhanced Further, if a silicon oxide film or $Si_3N_4$ film is used as the first thin film, the first and second thin films can be respectively formed by use of the vacuum deposition method and sputtering method, and therefore the degree of freedom can be enhanced.

Additional objects and advantages of the invention will be set forth in the description which follows, and in part will be obvious from the description, or may be learned by practice of the invention. The objects and advantages of the invention may be realized and obtained by means of the instrumentalities and combinations particularly pointed out in the appended claims.

BRIEF DESCRIPTION OF THE DRAWINGS

The accompanying drawing, which is incorporated in and constitutes a part of the specification, illustrates a presently preferred embodiment of the invention and, together with the general description given above and the detailed description of the preferred embodiment given below, serves to explain the principles of the invention.

FIG. 1 is cross sectional view of a semiconductor laser device according to one embodiment of this invention.

DETAILED DESCRIPTION OF THE PREFERRED EMBODIMENTS

As shown in FIG. 1, an n-type clad layer 12 is formed on the main surface of an n-type semiconductor substrate 10 and an active layer 14 is formed on the clad layer 12. A p-type clad layer 16 is formed on the active layer 14 and a cap layer 18 is formed on the clad layer 16. A p-type ohmic electrode 20 is formed on the cap layer 18 and an n-type ohmic electrode 22 is formed on the rear surface of the substrate 10. Thus, an oscillator 24 for oscillating a laser light is constituted by cleaving, in a specified direction, a wafer comprising substrate 10, semiconductor layers 12, 14, 16 and 18 and electrodes 20 and 22.

A reflectance control film 30 is formed on one of the end facets 24A and 24B of the oscillator 24, for example, on the surface 24B in FIG. 1, so as to enhance the output of laser light oscillated from the end face 24A. The reflectance control film 30 is formed of two types of thin films 32 and 34 having different refractive indices and a thin film having a refractive index n of small value is used as the first-layer thin film 32 formed in contact with the end facet 24B of the oscillator 24 and a thin film having a refractive index n of large value is used as the second-layer thin film 34.

The reflectivity R of the reflectance control film 30 is generally expressed by the following equation.

$$R = \left| \frac{n_0 n_2^2 - n_1^2}{n_0 n_2^2 + n_1^2} \right|^2 \quad (1)$$

The equation (1) is applied to a case wherein it is used in the atmosphere, and $n_0$ denotes the refractive index of the active layer 14, $n_1$ denotes the refractive index of the first-layer thin film 32 and $n_2$ denotes the refractive index of the second-layer thin film 34.

For example, when the first-layer thin film 32 is formed of $SiO_2$, $n_1$ becomes approx. 1.5, and when the active layer 14 is formed of InP-series or GaAs-series material, $n_0$ becomes approx. 3.2. With this fact taken into consideration, it is preferable to set the refractive index $n_2$ of the second-layer thin film 34 in a range of $1.9 \leq n_2 \leq 2.6$ according to the equation (1) in order to attain the optimum reflectivity R of 40% to 70%.

In this embodiment, the first-layer thin film 32 is formed of $SiO_2$ (the refractive index thereof is approx. 1.5) and the second thin film 34 is formed of zirconium oxide ($ZrO_2$: the refractive index thereof is approx. 2.0).

The film thicknesses of the thin films 32 and 34 respectively set to $\lambda/4n_1$ and $\lambda/4n_2$ when the peak wavelength of the semiconductor laser device (oscillator 24) is $\lambda$. For example, when the peak wavelength $\lambda$ of the semiconductor laser diode is set at 1.3 μm, the film thickness of the first-layer thin film ($SiO_2$) 32 is set at 2170 Å and the film thickness of the second thin film ($ZrO_2$) 34 is set at 1630 Å.

In this embodiment, the reflectivity of the reflectance control film 30 can be set to approx. 55% by using $SiO_2$ for forming the first-layer thin film 32 and using $ZrO_2$ for forming the second-layer thin film 34. As a result, a monitor current of more than 0.1 mA can be obtained even when a distance between the end facet 28 of the semiconductor laser device and the light receiving surface of a monitoring element (not shown) is approx. 1.5 mm.

The semiconductor laser device shown in FIG. 1 is manufactured as follows. First, the electrodes 20 and 22 are formed on the cap layer 18 and the rear surface of the substrate 10 after the respective semiconductor layers such as the clad layer 12, active layer 14, clad layer 16 and cap layer 18 are sequentially formed on the n-type semiconductor substrate 10 so that laser light can be generated therefrom. After formation of the electrodes 20 and 22, the oscillator 24 can be obtained by cleaving the semiconductor structure in a bar form or in a chip form. Next, the first-layer thin film 32 of $SiO_2$ is formed on the end facet 24B of the oscillator 24 by use of the vacuum deposition method, for example, electron beam deposition method and then the second-layer thin film 34 of $ZrO_2$ is formed on the thin film 32 by use of the electron beam deposition method, for example.

In this case, the $ZrO_2$ film can be formed by use of either the vacuum deposition method or sputtering method, and in either case, the deposition speed and the refractive index can be easily controlled with high precision. Further, $ZrO_2$ is extremely stable in the chemical and physical property. The inventors of this invention made experiments in order to prove this and found that no variation occurred in the refractive index after the heat treatment was effected for five minutes at a temperature of 430° C. in an atmosphere. Further, the result of the experiments showed that the etching speed in the ammonium fluoride solution was ⅓ and 1/5 of that obtained for $SiO_2$ or $Si_3N_4$.

The reason why the first-layer thin film 32 is formed of $SiO_2$ is that the deposition speed and the refractive index can be easily and precisely controlled when the $SiO_2$ film is formed by use of either the vacuum deposition method or sputtering method. Further, the first-layer thin film 32 and second-layer thin film 34 can be both formed by use of the vacuum deposition method, both formed by use of the sputtering method or formed by selectively using the vacuum deposition method and sputtering method, and thus the degree of freedom for the manufacturing process can be enhanced.

With the semiconductor laser device of the above construction, the degree of freedom is high in the optical design and manufacturing process and the reflectance control film is constituted by films which are extremely stable in the chemical and physical property. Thus, a semiconductor laser device which is highly reliable and has enhanced versatility can be obtained.

In the above embodiment, the first-layer thin film 32 is formed of $SiO_2$, but this invention is not limited to this and it may be formed of material such as $Si_3N_4$ having a refractive index of less than 1.8, for example. Further, the second-layer thin film 34 is not limited to $ZrO_2$ but may be formed of material whose refractive index is set in the range of $1.9 \leq n_2 \leq 2.6$ and which is chemically and physically stable and can be preferably formed with the high controllability for the deposition speed and refractive index by use of the vacuum deposition method or sputtering method.

For example, cesium oxide ($CeO_2$; the refractive index n is 2.2 to 2.5) or zinc sulfide (ZnS; the refractive index is 2.2 to 2.3) may be used as the material which can meet the above conditions of the refractive index and formation method. The reflectivity of the reflectance control film 30 can be set in the optimum range of 40 to 70% by using the above material for forming the thin film 34.

Further, if the refractive index is set in a range of $1.9 \leq n_2 \leq 2.6$ which $ZrO_2$, $CeO_2$, ZnS or the like has, the reflectance control film 30 may be formed of a two-layered structure of the first-layer thin film 32 and the second-layer thin film 34 so as to have an optimum reflectance of 40 to 70%. As a result, the total number of thin films formed can be reduced, and enhancement of the uniformity of the film, reduction in the stress between the films, enhancement of the manufacturing yield, reduction in the time of the manufacturing process can also be attained.

What is claimed is:

1. A semiconductor laser device comprising:
   an oscillator for oscillating a laser light;
   a first thin film for reflectance control which is formed on the end facet of said oscillator and in which the film thickness is set to be "$\lambda/4n_1$" and $n_1 \leq 1.8$ where the peak wavelength of said oscillator is $\lambda$ and the refractive index of said first thin film is $n_1$; and
   a second thin film for reflectance control which is formed on said first thin film and in which the film thickness is set to be "$\lambda/4n_2$" and $1.9 \leq n_2 \leq 2.6$ where the peak wavelength of said oscillator is $\lambda$ and the refractive index of said second thin film is $n_2$.

2. A semiconductor laser device according to claim 1, wherein said first thin film is one of a silicon oxide film and an $Si_3N_4$ film.

3. A semiconductor laser device according to claim 2, wherein said first thin film is formed on the end facet of said oscillator by use of the vacuum deposition method.

4. A semiconductor laser device according to claim 2, wherein said first thin film is formed on the end facet of said oscillator by use of the sputtering method.

5. A semiconductor laser device according to claim 1, wherein said second thin film is formed of any one of zirconium oxide, cesium oxide and zinc sulfide.

6. A semiconductor laser device according to claim 5, wherein said second thin film is formed on said first thin film by use of the vacuum deposition method.

7. A semiconductor laser device according to claim 5, wherein said second thin film is formed on said first thin film by use of the sputtering method.

* * * * *